United States Patent

Giles

[11] Patent Number: 5,874,732
[45] Date of Patent: Feb. 23, 1999

[54] ROTATION SENSOR

[75] Inventor: Terence George Giles, Surrey, United Kingdom

[73] Assignee: Ramar Technology Ltd., United Kingdom

[21] Appl. No.: 738,751

[22] Filed: Oct. 28, 1996

[30] Foreign Application Priority Data

Dec. 22, 1995 [GB] United Kingdom .................. 9526415

[51] Int. Cl.$^6$ .................................................. G01R 21/00
[52] U.S. Cl. .................. 250/231.17; 324/142; 340/637; 250/231.14
[58] Field of Search .................. 250/231.17, 231.13, 250/231.14, 231.15, 231.16, 231.18; 324/142, 140 R, 137, 134; 340/637, 635, 660

[56] References Cited

U.S. PATENT DOCUMENTS

| | | | |
|---|---|---|---|
| 4,165,485 | 8/1979 | Takahashi | 324/142 |
| 4,204,115 | 5/1980 | Boldridge, Jr. | 250/227 |
| 4,321,531 | 3/1982 | Marshall | 324/142 |
| 4,328,463 | 5/1982 | Avins | 328/133 |
| 4,636,637 | 1/1987 | Van Orsdel | 250/231 SE |
| 4,650,995 | 3/1987 | Tokunaga et al. | 250/231 SE |
| 4,792,677 | 12/1988 | Edwards et al. | 250/231 SE |
| 4,797,549 | 1/1989 | Ho et al. | 250/227 |
| 4,956,551 | 9/1990 | Repschläger et al. | 250/231.14 |
| 4,978,911 | 12/1990 | Perry et al. | 324/142 |
| 5,113,071 | 5/1992 | Sawada et al. | 250/231.14 |
| 5,130,641 | 7/1992 | Cornwall et al. | 324/96 |
| 5,153,437 | 10/1992 | Nishii et al. | 250/231.14 |
| 5,406,075 | 4/1995 | Pattenden | 250/227.21 |
| 5,442,281 | 8/1995 | Frisch et al. | 324/137 |

FOREIGN PATENT DOCUMENTS

| | | | |
|---|---|---|---|
| 2144220 | 2/1985 | United Kingdom | G08C 9/06 |
| 2171508 | 8/1986 | United Kingdom | G01B 11/02 |
| 2231146 | 11/1990 | United Kingdom | G01D 18/00 |
| WO 9428428 | 12/1994 | WIPO | G01R 11/36 |

*Primary Examiner*—Edward P. Westin
*Assistant Examiner*—John R. Lee
*Attorney, Agent, or Firm*—Chapman and Cutler

[57] ABSTRACT

A sensor for counting rotations of a Ferraris disk in an electricity meter. The disk has a light reflecting surface carrying a broad stripe marking. The sensor comprises two IR LEDs spaced at either side of an intermediate phototransistor adapted to receive light reflected from the disk from both LEDs. The LEDs are spaced in the direction of rotation by at least the width of the stripe. As the stripe passes across the detector, the output signal generated has characteristic shoulders on its falling and rising edges. By detecting this characteristic pattern and checking that the LEDs which contribute to the signal at the shoulder point are in the correct sequence for the normal direction of rotation, it is possible to detect false counts caused by jitter, tampering or changes in ambient light level. During production the LEDs are balanced by a calibration process so that the signal processed by the photo-detector is essentially steady, despite the switching of the LEDs when the sensor is exposed to a normal reflective surface.

9 Claims, 1 Drawing Sheet

ROTATION SENSOR

BACKGROUND OF THE INVENTION

1. Field of the Invention

The present invention relates to apparatus for sensing rotation of a disk and is particularly suitable for counting the rotations of a Ferraris disk in an electricity meter.

2. Description of Related Art

A watthour meter has a Ferraris disk which rotates in one sense at a rate dependent upon the power being consumed. If power is being delivered rather than consumed, the disk would rotate in the opposite sense. However in a normal domestic situation rotation in the opposite sense is more likely to be due to tampering. In a typical domestic meter rotations of the disk are counted mechanically and the cumulative number of rotations is shown on a series of displays. In order to provide for remote meter reading it is necessary to produce and store electrical signals representing a count of the number of rotations since the last meter reading was taken. This count can be stored in memory and cumulated until the meter is read.

The Ferraris disk of a conventional electricity meter has a shiny reflective surface and is provided with a broad black stripe on one face. It is desirable to use this existing marking as the basis for any sensor. It is known to use an optical method for counting rotations of such a marked disk. For example, U.S. Pat. No. 5,130,641 (Cornwall et al assigned to AMRplus Partners) and U.S. Pat. No. 4,204,115 (Boldridge assigned to Conversational Systems) both describe systems in which a light source is focused on markings on the edge of a disk with a detector aligned to receive light reflected from the edge of the disk when markings are not present.

A number of technical problems are associated with this type of optical sensor.

These include:

Variations in ambient light can affect the performance of the sensor.

Eddy currents induced in the disk can cause it to jitter and vibrate when no power is being consumed, particularly when consumption ceases. If such vibrations occur when a marking is close to the sensor, false counts may be detected.

Because the sensor is normally retro fitted to an existing meter, it is desirable to have simple optics, whereas some of the existing systems would require an elaborate alignment or focusing system which may make installation difficult.

In order to provide bi-directional counting, it has been proposed to use systems with spaced detectors which detect the marking in sequence. For example, such systems are described by Marshall in U.S. Pat. No. 4,321,531 and Avins in U.S. Pat. No. 4,328,463. These sensors are primarily for use in applications where the disk may be continuously rotating in one or other direction rather than for dealing with the technical problem of vibrations and jitter needed for a domestic meter which is designed to measure electricity consumption only.

The apparatus described in WO-A-94/28428 (Itron) comprises two sources of electromagnetic energy which are preferably infra-red light emitting diodes together with a single photo-diode sensitive to the infra-red pulses reflected from the surface of the disk. The photo-diode is located between the two LEDs, which are carefully focused in order to reflect from different areas of the disk which are separated in the direction of rotation. Each LED is pulsed with a different sequence and the resulting signal detected by the photo-diode is processed in order to determine the number of rotations of the disk and the direction of rotation of the disk. Although Itron uses infra-red LEDs to avoid some of the problems of varying levels of ambient light, the arrangement described may be susceptible to false triggering in high ambient light levels, particularly where the outputs of each LED are at different levels which would be typical.

SUMMARY OF THE INVENTION

The present invention eliminates some of the complexities of the Itron system in respect of the optical arrangement and the pulse sequences of the LED.

The sensor of the present invention is defined in the claims.

The spacing of the light sources is selected so that a characteristically shaped output signal is generated by the photo-detector as shown in FIG. 1. This signal has shoulders 2 on both the downward and upward side of the characteristic dip produced as the marking passes across the sensor. Each shoulder occurs as the leading edge of the marking passes between the areas illuminated by the light sources.

By recognizing this characteristic pulse shape produced by a continuous movement of the marking across the sensor, only true counts are accumulated. If the marking is vibrating close to the sensor, then the output from the photo-detector will not have the characteristic double shoulder shape and possible false counts can therefore be eliminated.

Direction of rotation can also be sensed if required by switching one source off when a shoulder is detected to enable the processor to determine which source is affected by the marking.

BRIEF DESCRIPTION OF THE DRAWINGS

An embodiment of the invention will now be described, by way of example only, with reference to the accompanying diagrammatic drawings, in which.

DESCRIPTION OF THE PREFERRED EMBODIMENT

The sensor 10 comprises a pair of light sources which are infra-red light emitting diodes 12, 14. These sources are arranged one either side of a photo-detector which is a photo-transistor 16. These three components can be mounted on a printed circuit board which is positioned adjacent to the disk 4 in an electricity meter.

Figure 1:
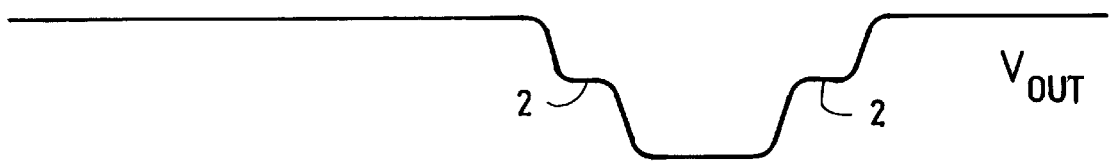
FIG. 1 shows a typical output voltage plot against time of a photo-detector in the sensor of the present invention as a stripe marking moves across the region illuminated by the sensor.
Figure 2:
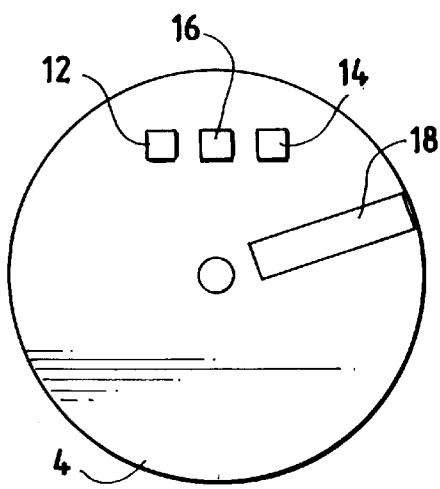
FIG. 2 is a diagrammatic plan view showing the arrangement of the sensor components relative to a Ferraris disk in use.
Figure 3:
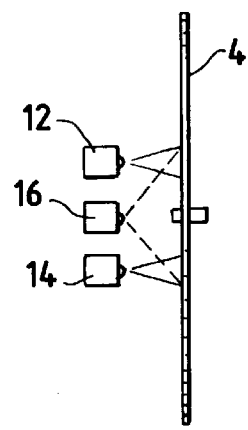
FIG. 3 is a side view showing the beams produced by light sources.

It is assumed that the sensor will be retro-fitted to an existing meter or installed during the manufacture of new domestic meters. Such meters conventionally have a reflective disk 4 which carries a broad radial non-reflective stripe marking 18 as shown in FIG. 1. It will be appreciated that this type of sensor can be adapted for use with other types of marking which affect the ability of the disk to reflect incident light. It is not essential that the marking should be a stripe as illustrated and, although the term stripe is used, the sensor would also work with a non-elongate marking, provided that the sensor was positioned such that the marking passed over it during the course of rotation. The marking could also be an aperture in the disk.

The centers of the IR LEDs 12, 14 are spaced by approximately the width of the stripe 18 and are such that the areas illuminated on the disk are preferably spaced. However, it is found that the precise areas illuminated are not critical and the sensor is effective even if somewhat misaligned.

Figure 4:
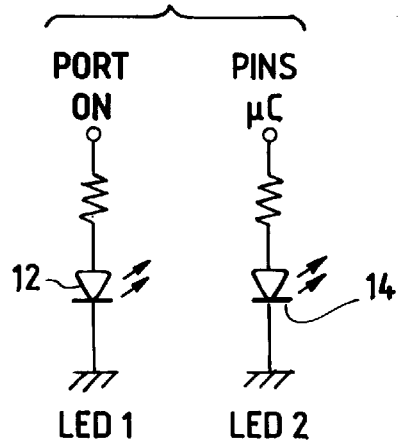
FIG. 4 is a circuit diagram of a pair of infra-red light emitting diodes.
Figure 5:
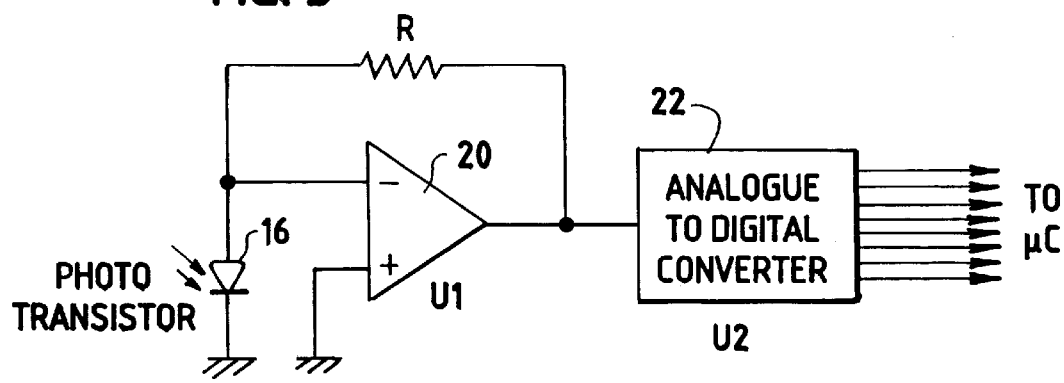
FIG. 5 is a circuit diagram of the sensor of the present invention.

The output from the photo-transistor 16 is passed through a current to voltage converter 20 as shown in FIG. 4 and then to an analog to digital converter 22 which has an output fed to a microprocessor (not shown). The processor may also be connected to the LEDs 12, 14 to control switching of the LEDs in some embodiments.

The output signal ($V_{out}$) from the current to voltage converter 20 has a shape as illustrated in FIG. 1. $V_{out}$ is a function of both ambient light level and illumination of the IR LEDs 12, 14. As previously described the shape of the pulse is significant and characteristic. The trace shown in FIG. 1 represents the passage of the stripe 18 across the sensor. A shoulder 2 is produced on both the falling and rising edge of the pulse. This shoulder 2 is the point where illumination is only provided by one of the two IR LEDs 12, 14. For the purposes of clear illustration, the pulse in FIG. 1 has been shown as symmetrical. However, it is unlikely that any two IR LEDs would be perfectly balanced. In practice, the processor preferably analyses a signal representing the relative output of the two IR LED sources at the significant shoulder points. In one embodiment the processor alternately switches the LEDs on and off so that when one LED is on, the other is off. By feeding to the processor the same sequence as that which is used to control the switching of the LEDs, it is possible for the processor to identify which LED is contributing to the signal produced at each shoulder. If the stripe is moving continuously across the sensor in normal rotation, then one IR LED, say 12, will contribute to the signal at the first shoulder on the falling edge and the other LED, say 14, will contribute to the signal detected at the shoulder on the rising edge of the pulse. If the same LED contributes to the shoulder on each edge of the pulse, then this is an indication that the stripe has not moved across the sensor but has jittered back and forth over only one of the areas illuminated by the sensor. Such false counts can therefore readily be eliminated.

It will be appreciated that IR LEDs produce different levels of light. It is therefore desirable to run a pre-calibration process so that the shape of the $V_{out}$ pulse will be balanced. In order to pre-calibrate the sensor, a simple calibration sequence is followed. One IR LED is turned on and the value of the digital signal output from the analog to digital converter 22 is noted. That LED is then turned off and the second LED turned on and another reading made. These readings are then used to normalize the readings produced in use by the sensor. For example, if the voltage measured during the calibration process is greater for the first sensor than for the second, then during the periods for which that first sensor is on, an offset equal to the difference between the calibration values is applied to the output of the analog to digital converter 22. When only the output of the weaker IR LED is contributing to $V_{out}$ no offset is applied. In the simplest system where there is little threat of meter tampering the IR LEDs are powered on continuously. The processor is then programmed to identify a sequence within a fixed time period of:

a period of reduced signal indicative of illumination by only one IR LED source.

a period of minimum signal indicative of no light from either IR LED reaching the photo-transistor 16.

A period of reduced signal indicative of illumination by only one IR LED source.

Only if this full sequence is observed will the pulse count be incremented to record the rotation.

Because no switching is used no direction information is obtained and such a sensor could, in theory, register false counts if the disk oscillated with the edge of the stripe over the sensor.

In the preferred arrangement already described the IR LEDs are alternately switched. This not only allows effective balancing of the outputs to be achieved to allow for the effect of ambient radiation but also permits direction information to be retrieved. In this case the sequence to be identified by the processor in order to register a count requires that the LED contributing to the signal during the periods of reduced signal are in the correct order for the expected direction of rotation in a domestic meter.

In an alternative arrangement, the processor applies a pulse width modulation (PWM) drive waveform to each LED. The respective drives are adjusted to balance the LEDs using an analogue locked loop to maintain the intensity of each LED in balance. The presence of the stripe would cause the loops to become unbalanced and the direction of the control needed to bring it back into balance would indicate which LED had been obscured. To detect a count the processor would detect a sequence of control corrections in opposite directions with a period of balance but low signal in between.

The PWM carrier will be removed by the integration in the current to voltage converter 20. This converter could also be replaced by a simple level detector. In this case the loop would continuously adjust the PWM drive signals so that each LED just exceeded the pre-set level. The PWM ratio would then be a measure of the contribution from each LED.

The width of the stripe on the disk is such that for most of the time, for example, more than 90%, the reflective portion of the disk will be exposed to the sensor. Because of the balancing of the LEDs the $V_{out}$ value during this time will be approximately the same. There will be slight variations due to changes in the disk surface but these will typically be insignificant relative to the variation generated by the presence of the stripe.

Provided the switching sequences of the two LEDs are out of phase, further power can be saved by turning on each LED occasionally whilst a measurement is being made. For example, a sampling rate of every 10 milliseconds is adequate for a typical 30 KWH meter measuring 7.2W per revolution. In this example, each LED would be turned on for one millisecond.

The initial calibration so that the outputs from each LED are balanced compensates for the manufacturing tolerances in the IR LEDs. Even though the reflection characteristics of the disk and ambient light levels will change with time, the sensor of the present invention will be immune to such variations because it is not looking for an absolute level, but the characteristic signal as shown in FIG. 1 as the stripe moves across the sensor.

False counts are avoided by detecting the full sequence of changes. It will be appreciated that the simple circuitry described and the absence of any optical assembly make the present sensor extremely advantageous.

I claim:

1. A sensor for detecting rotation of a disk which has at least one marking which affects the reflective properties of the disk, the sensor comprising:

first and second light sources arranged with their optical axes spaced by at least a width of the marking in the direction of rotation;

a single photo-detector, wherein the first and second light sources are spaced on opposite sides of the single photo-detector, the single photo-detector for receiving light reflected from the disk from either source and producing an output signal; and a processor for analyzing the output signal from the photo-detector; the processor having means for registering a count if it detects in sequence a period of a reduced level of the output signal indicative of illumination from only one light source followed by a period of a minimum level of the output signal indicative of minimal light from both light sources reaching the photo-detector followed by a further period of a reduced level of output signal.

2. A sensor as claimed in claim 1, wherein the processor includes means for analyzing the output signal representing the relative output of the first and second light sources.

3. A sensor as claimed in claim 2, wherein the processor includes means for applying an offset to the output signal produced by the photo-detector in order to correct imbalances between the output of the two light sources; said offset determined by a pre-calibration process.

4. A sensor as claimed in claim 1, wherein the first and second light sources are pulsed on and off alternately.

5. A sensor as claimed in claim 2, wherein the first and second light sources are pulsed on and off alternately.

6. A sensor as claimed in claim 3, wherein the first and second light sources are pulsed on and off alternately.

7. A sensor as claimed in claim 1, wherein the light sources are driven by respective pulse width modulation signals and are connected in analog locked loops set to control the level of the photo-detector output signal at a pre-set level, and the processor for registering a count includes means for detecting control corrections needed to maintain the pre-set level.

8. A sensor as claimed in claim 2, wherein the light sources are driven by respective pulse width modulation signals and are connected in analog locked loops set to control the level of the photo-detector output signal at a pre-set level, and the processor for registering a count includes means for detecting control corrections needed to maintain the pre-set level.

9. A sensor as claimed in claim 3, wherein the light sources are driven by respective pulse width modulation signals and are connected in analog locked loops set to control the level of the photo-detector output signal at a pre-set level, and the processor for registering a count includes means for detecting control corrections needed to maintain the pre-set level.

* * * * *